(12) United States Patent
Savoj

(10) Patent No.: US 7,227,393 B1
(45) Date of Patent: Jun. 5, 2007

(54) METHOD AND APPARATUS FOR ADAPTIVE DELAY CANCELLATION IN HIGH-SPEED WIRELINE TRANSMITTERS

(75) Inventor: Jafar Savoj, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 10/997,236

(22) Filed: Nov. 24, 2004

Related U.S. Application Data

(60) Provisional application No. 60/576,798, filed on Jun. 3, 2004.

(51) Int. Cl.
*H03L 7/06* (2006.01)
(52) U.S. Cl. .................. 327/147; 327/149
(58) Field of Classification Search ........... 327/147, 327/149, 153, 158, 156, 161–163; 331/1 A, 331/17, 25, DIG. 2; 375/373–376
See application file for complete search history.

(56) References Cited

U.S. PATENT DOCUMENTS 4,926,447 A * 5/1990 Corsetto et al. ............ 375/376
6,323,711 B2 * 11/2001 Truong et al. .............. 327/259
6,819,626 B2 * 11/2004 Okuda et al. ............... 365/233
6,828,835 B2 * 12/2004 Cho ........................... 327/158
6,859,081 B2 * 2/2005 Hong et al. ................. 327/175
2004/0071227 A1 * 4/2004 Lee ............................ 375/308

OTHER PUBLICATIONS

IEEE Computer Society, "*IEEE Standard for Information Technology—Telecommunications and Information Exchange Between Systems—Local and Metropolitan Area Networks—Specific Requirements—Part 3: Carrier Sense Multiple Access with Collision Detection (CSMA/CD) Access Method and Physical Layer Specifications*—Amendment: Media Access Control (MAC) Parameters, Physical Layers, and Management Parameters for 10 Gb/s Operation", IEEE Std 802.3ae—2002.
"*SONET OC-192 Transport System Generic Criteria*", GR-1377-CORE, Issue 5, Dec. 1998.

* cited by examiner

*Primary Examiner*—Linh My Nguyen

(57) ABSTRACT

A phase locked loop (PLL) clock divider is provided that, in one implementation, includes a divider and a delay locked loop. The divider is operable to divide a reference clock signal and generate a divided clock signal. The divided clock signal has a different frequency relative to the reference clock signal. The delay locked loop is operable to substantially align the divided clock signal to the reference clock signal.

72 Claims, 5 Drawing Sheets

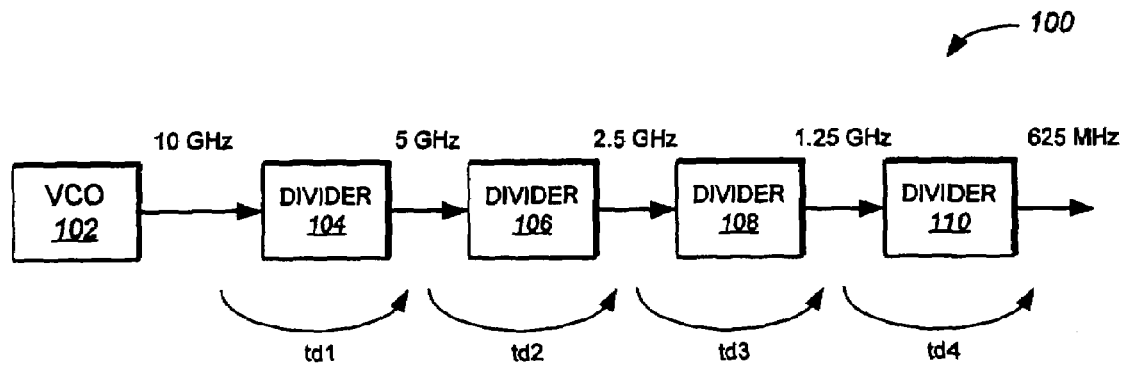
FIG. _1 (PRIOR ART)
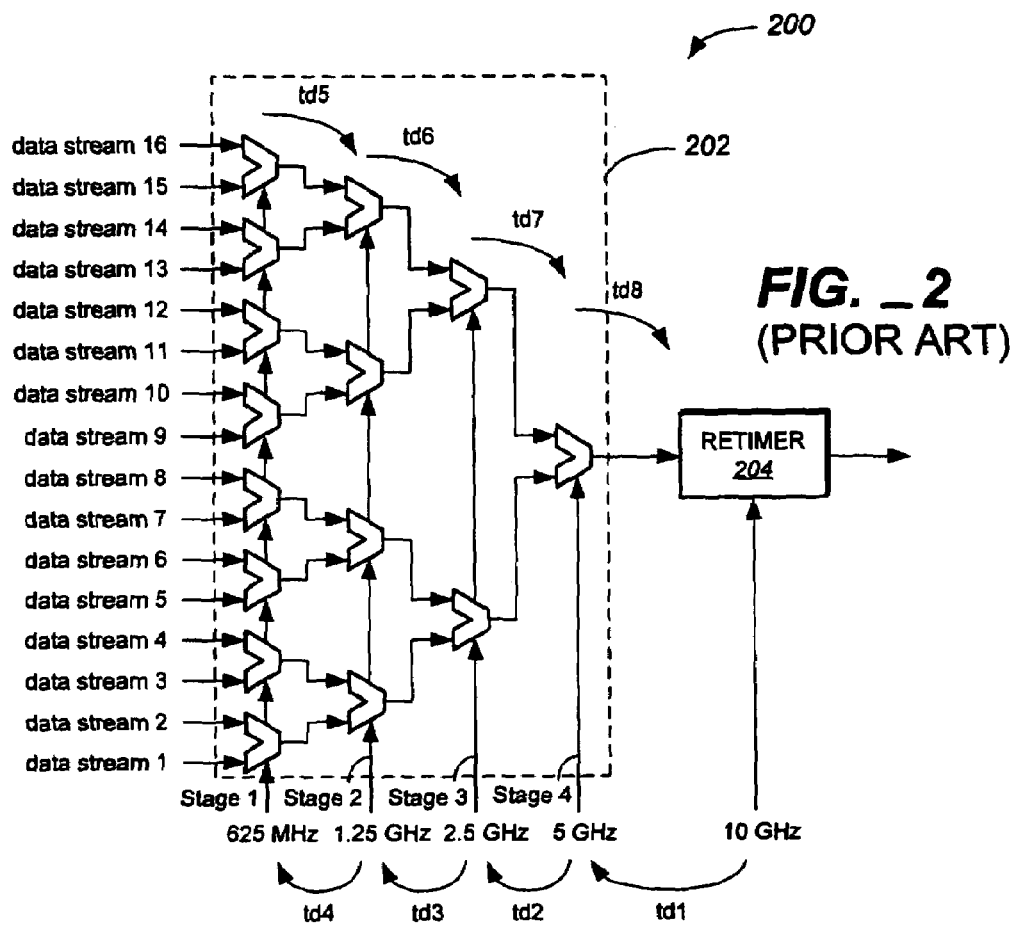
FIG. _2 (PRIOR ART)

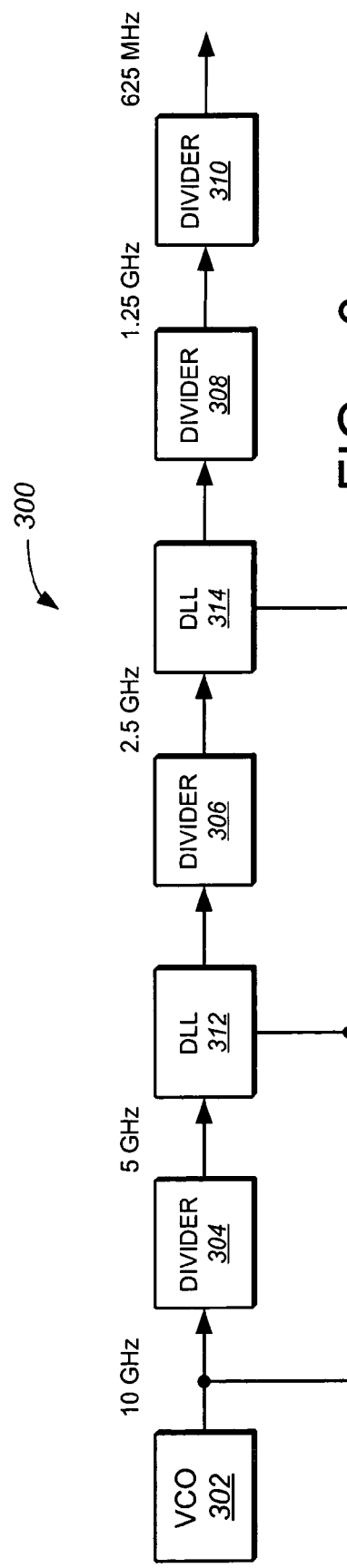
FIG._3
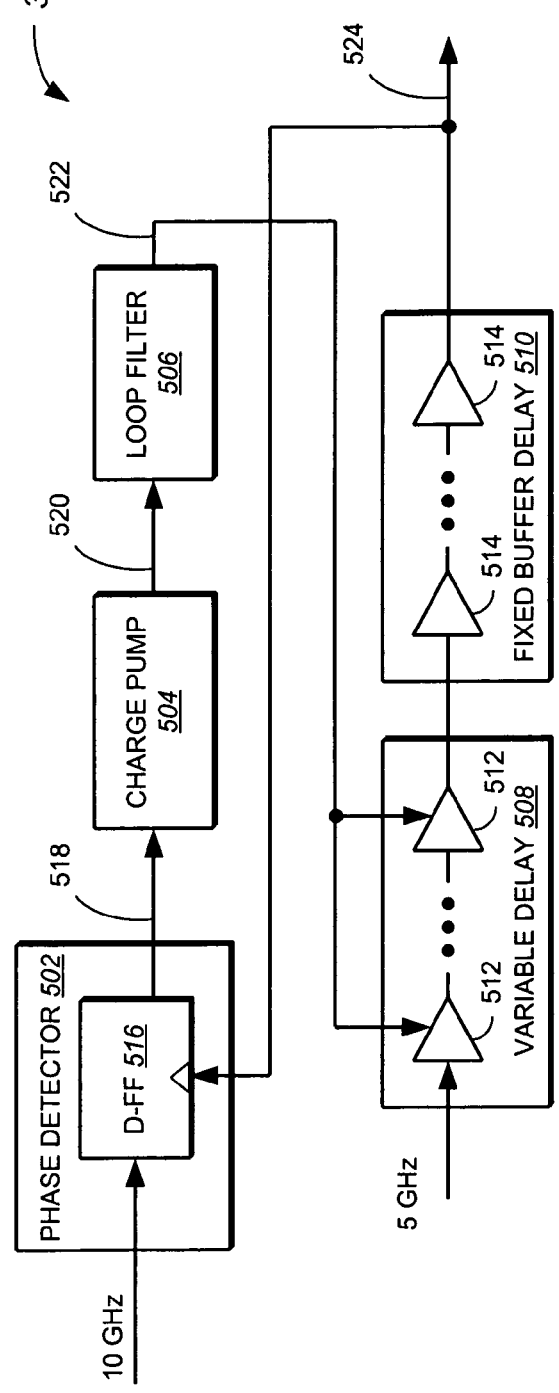
FIG._5

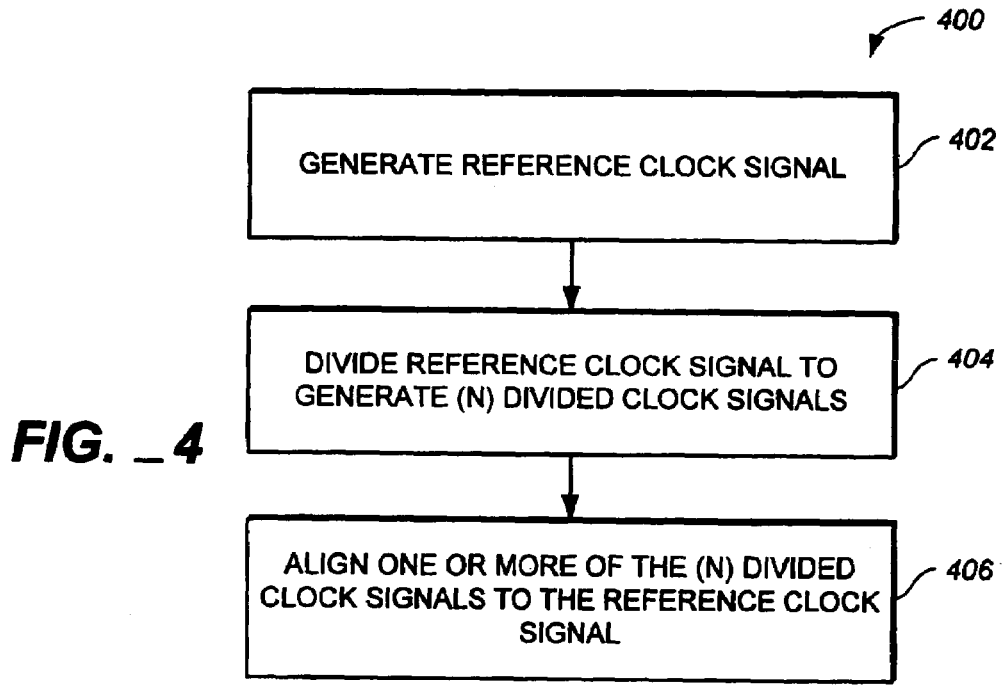
FIG._4
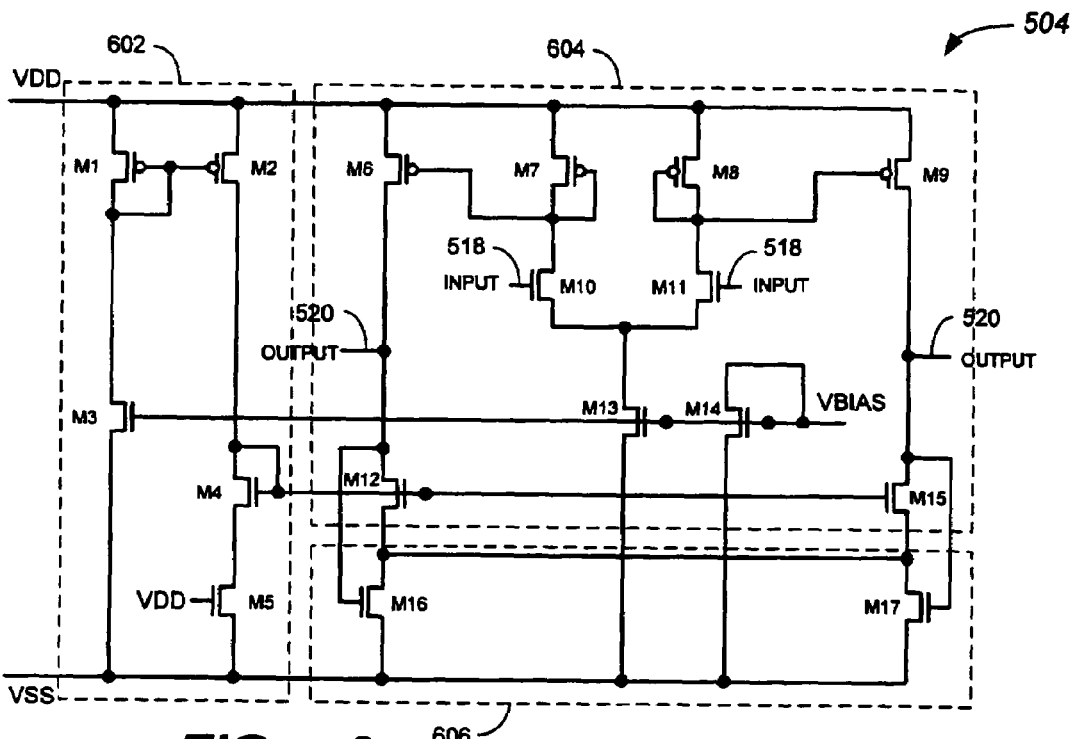
FIG._6

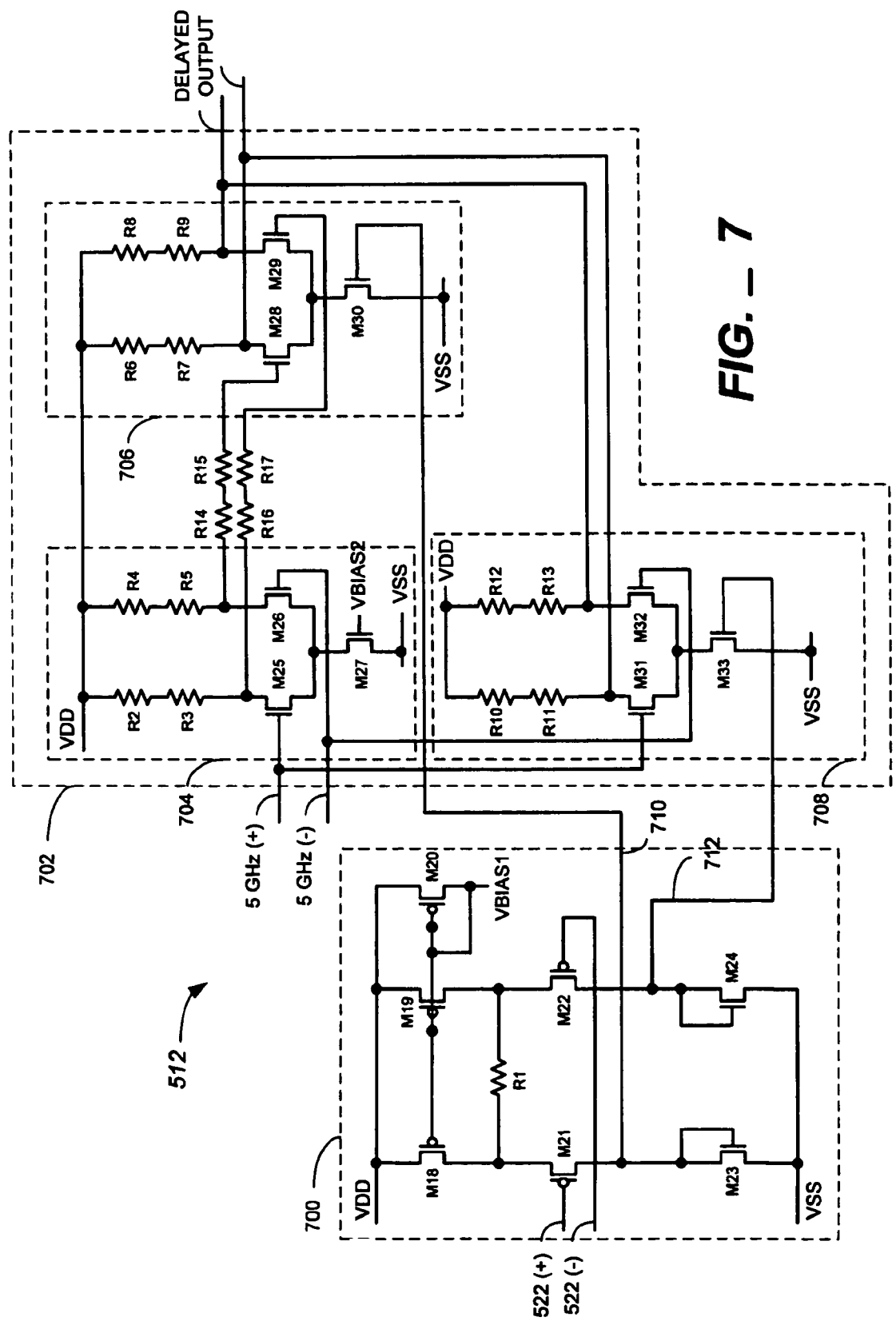
FIG. _ 7

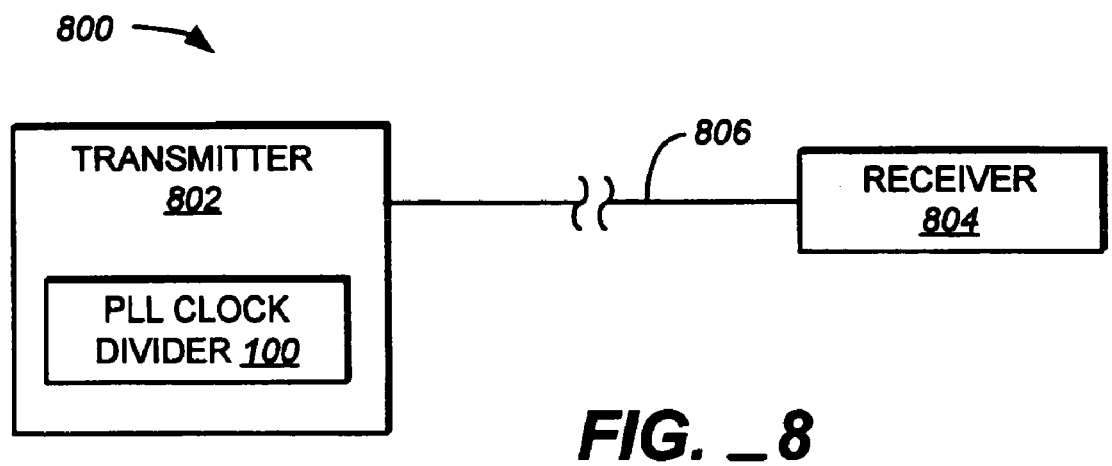
FIG. _8

METHOD AND APPARATUS FOR ADAPTIVE DELAY CANCELLATION IN HIGH-SPEED WIRELINE TRANSMITTERS

CROSS-REFERENCE TO RELATED APPLICATIONS

The present application claims priority to U.S. Provisional Patent Application No. 60/576,798, filed on Jun. 3, 2004, which is incorporated herein by reference in its entirety.

BACKGROUND

The following disclosure relates to electrical circuits and signal processing.

High speed transmitters (e.g., a 10 GHz wireline transmitter) typically include a phase locked loop (PLL) clock divider for generating multiple clock signals, each having a different phase.

FIG. 1 shows one example of a conventional PLL clock divider 100. Phase interpolator 100 includes a voltage controlled oscillator (VCO) 102 and clock dividers 104–110. In the example shown, VCO 102 produces a 10 GHz clock signal that is respectively divided into a 5 GHz clock signal, a 2.5 GHz clock signal, a 1.25 GHz clock signal, and a 625 MHz clock signal by clock dividers 104–110. Due to an inherent delay associated with each of clock dividers 104–110, the 5 GHz clock signal is typically skewed (or delayed) with respect to the 10 GHz clock signal as represented by delay td1 in FIG. 1. Similar delays td2, td3, td4 are associated with the 2.5 GHz clock signal, the 1.25 GHz clock signal, and the 625 MHz clock signal.

In a high speed transmitter, the multiple clock signals generated by a PLL clock divider (e.g., PLL clock divider 100) can be used to combine parallel data streams into a serial data stream through a serializer circuit. FIG. 2 shows a conventional serializer circuit 200 including a four stage multiplexer 202 and a retiming circuit 204. As shown in FIG. 2, (16) low speed (e.g., 625 MHz) streams of data—i.e., data streams 1–16—are combined through multiplexer 202 to generate a high speed (e.g., 10 GHz) data stream. The clock signals generated by PLL clock divider 100 are respectively used to clock each stage of multiplexer 200 and to retime a final data stream through retiming circuit 204. Data streams 1–16 are typically delayed by each stage of multiplexer 202 as represented by delays td5–td8. Each delay td5–td8 is substantially equal to (1) clock-to-Q delay. A clock-to-Q delay represents an amount of time from assertion of a multiplexer clock until the multiplexer output becomes valid.

As a result of clock signal delays td1–td4 and data stream delays td5–td8, clock signals and data streams may lose alignment as lower speed data streams are combined into data streams of higher rate. Such loss of alignment may adversely affect the integrity and yield of data being transmitted from a high speed transmitter.

SUMMARY

In general, in one aspect, this specification describes a phase locked loop (PLL) clock divider including a divider and a delay locked loop. The divider is operable to divide a reference clock signal and generate a divided clock signal. The divided clock signal has a different frequency relative to the reference clock signal. The delay locked loop is operable to substantially align the divided clock signal to the reference clock signal.

Particular implementations can include one or more of the following features. The substantially aligned divided clock signal can lead the reference clock signal by a predetermined amount. The predetermined amount can be substantially (1) clock-to-Q delay. The delay locked loop can include a phase detector operable to compare a phase of the reference clock signal to a phase of the divided clock signal and generate an error signal corresponding to a phase difference between the reference clock signal and the divided clock signal. The phase detector can include a D Flip Flop that receives the reference clock signal as an input, and the D Flip Flop can be triggered by the divided clock signal. The delay locked loop can further include a charge pump operable to convert the error signal into a charge pump output signal. The charge pump can include a differential charge pump circuit, and a biasing stage operable to bias the differential charge pump circuit. The charge pump can further include a common mode feedback circuit operable to adjust the charge pump output signal based on a common mode voltage level of the charge pump output signal. The common mode feedback circuit can include one or more NMOS transistors operating in or near a triode region.

The delay locked loop can further include a loop filter operable to smooth the charge pump output signal and generate a control signal to control a delay of the divided clock signal. The delay locked loop can further include a variable delay element operable to delay the divided clock signal responsive to the control signal. The variable delay element can include one or more tuneable delay buffers. Each tuneable delay buffer can delay the divided clock signal through one or more signal paths. Each signal path can provide a different delay for the divided clock signal. The delay locked loop can further include a fixed buffer delay operable to delay the divided clock signal by a pre-determined amount and increase a drive capability of the divided clock signal. The PLL clock divider can further include a voltage controlled oscillator (VCO) operable to generate the reference clock signal.

In general, in another aspect, this specification describes a transceiver. The transceiver includes a PLL clock divider including a divider and a delay locked loop. The divider is operable to divide a reference clock signal and generate a divided clock signal. The divided clock signal has a different frequency relative to the reference clock signal. The delay locked loop is operable to substantially align the divided clock signal to the reference clock signal. The transceiver can be IEEE SONET OC-192 or IEEE XAUI compliant.

In general, in another aspect, this specification describes a PLL clock divider. The PLL clock diver includes a voltage controlled oscillator (VCO) operable to generate a reference clock signal having a reference frequency; a first divider operable to divide the reference clock signal and generate a first divided clock signal having a first frequency; a first delay locked loop operable to substantially align the first divided clock signal to the reference clock signal; a second divider operable to divide the substantially aligned first divided clock signal and generate a second divided clock signal having a second frequency; and a second delay locked loop operable to substantially align the second divided clock signal to the reference clock signal.

In general, in another aspect, this specification describes a method. The method includes dividing a reference clock signal and generating a divided clock signal. The divided clock signal has a different frequency relative to the reference clock signal. The method further includes substantially aligning the divided clock signal to the reference clock signal.

Implementations can include one or more of the following advantages. In one implementation, a clock divider circuit is provided that improves the yield and integrity of data being transmitted by a high speed transmitter. The clock divider circuit precisely aligns clock signals in the middle of the data eye, using an approach that, in one implementation, is insensitive to supply and process variations. The high speed transmitter can therefore achieve a lower bit error rate and higher tolerance to clock jitter.

The details of one or more implementations are set forth in the accompanying drawings and the description below. Other features and advantages will be apparent from the description and drawings, and from the claims.

DESCRIPTION OF DRAWINGS

FIG. 1 is a block diagram of a conventional phase locked loop (PLL) clock divider.

FIG. 2 is block diagram of a conventional serializer circuit.

FIG. 3 is a block diagram of a PLL clock divider.

FIG. 4 shows a method for generating one or more divided clock signals in the PLL clock divider of FIG. 3.

FIG. 5 is a block diagram of a delay locked loop (DLL) within the PLL clock divider of FIG. 3.

FIG. 6 is a schematic diagram of a charge pump circuit in the DLL of FIG. 5.

FIG. 7 is a schematic diagram of a tuneable delay buffer in the DLL of FIG. 5.

FIG. 8 is a block diagram of a transceiver system.

Like reference symbols in the various drawings indicate like elements.

DETAILED DESCRIPTION

FIG. 3 illustrates a block diagram of a phase locked loop (PLL) clock divider 300. PLL clock divider 300 generates one or more clock signals, each having a different phase, that are substantially aligned with a reference clock signal. In one implementation, a 10 GHZ reference clock signal is generated by a voltage controlled oscillator (VCO) 302 within PLL clock divider 300. VCO 302 can generate a reference clock signal having a higher or lower frequency than 10 GHz. PLL clock divider 300 includes VCO 302, dividers 304–310 and delay locked loops (DLLs) 312–314.

An output of VCO 302 is in communication with an input of divider 304 and a first input of each DLL 312–314. An output of divider 304 is in communication with a second input of DLL 312. An output of DLL 312 is in communication with an input of divider 306. An output of divider 306 is in communication with a second input of DLL 314. An output of DLL 314 is in communication with divider 308. An output of divider 308 is in communication with an input of divider 310.

In one implementation, each of dividers 304–310 are divide-by-two circuits. Thus, in the example of FIG. 1, divider 302 receives the 10 GHz reference clock signal (generated by VCO 302) and generates a divided clock signal having a frequency substantially equal to 5 GHz. DLL 312 receives both the 5 GHz clock signal and the 10 GHz reference clock signal, and substantially aligns the 5 GHz signal to the 10 GHz reference clock signal. Divider 306 receives the aligned 5 GHz clock signal and generates a divided clock signal having a frequency substantially equal to 2.5 GHz. DLL 314 receives both the 2.5 GHz clock signal and the 10 GHz reference clock signal, and substantially aligns the 2.5 GHz signal to the 10 GHz reference clock signal. Divider 308 receives the aligned 2.5 GHz clock signal and generates a divided clock signal having a frequency substantially equal to 1.25 GHz. Divider 310 receives the 1.25 GHz clock signal and generates a divided clock signal having a frequency substantially equal to 625 MHz. The 1.25 GHZ clock signal and the 625 MHz clock signal can be substantially aligned to the 10 GHz reference clock signal using conventional buffer techniques (not shown) because the frequency is lower. The buffer delay changes due to supply and temperature variations will be a small fraction of the low-frequency-clock period. Alternatively, the 1.25 GHZ clock signal and the 625 MHz clock signal can be substantially aligned to the 10 GHz reference clock signal using a DLL.

DLLs 314–316 substantially align the 5 GHz clock signal and the 2.5 GHZ signal, respectively, such that the 5 GHz clock signal and the 2.5 GHz signal each leads the 10 GHz signal by a predetermined amount. In one implementation, the predetermined amount is substantially (1) clock-to-Q delay. The clock-to-Q delay between the 10 GHZ clock signal and each of the 5 GHz clock signal and the 2.5 GHz clock signal substantially cancels corresponding clock-to-Q delays (e.g., td7, td8 of FIG. 2) of data streams being combined through a multiplexer (e.g., multiplexer 202 of FIG. 2).

FIG. 4 shows a method 400 for generating one or more divided clock signals of a PLL clock divider (e.g., PLL clock divider 300 of FIG. 3). A reference clock signal (e.g., a 10 GHz reference clock signal) is generated (step 402). In one implementation the reference clock signal is generated by a VCO (e.g., VCO 302). The generated reference clock signal can have any frequency, for example, the reference clock signal can have a frequency substantially higher than 10 GHz, or lower than 10 GHz. The reference clock signal is divided to generate (N) divided clock signals, in which (N) is an integer greater than zero (step 404). In one implementation, the reference clock signal is divided using divide-by-two circuits (e.g., dividers 304–308). The reference signal can be divided by factors other than (2).

One or more of the (N) divided clock signals are substantially aligned to the reference clock signal (step 406). In one implementation, one or more of the (N) divided clock signals are substantially aligned to the reference clock signal such that each divided clock signal substantially leads the reference clock signal by (1) clock-to-Q delay. The clock-to-Q delay between the reference clock signal and each divided clock signal substantially cancels corresponding clock-to-Q delays encountered by data streams as they are combined within a multiplexer (e.g., multiplexer 202) within a serializer circuit (e.g., serializer circuit 200).

FIG. 5 illustrates one implementation of DLL 312 of FIG. 3. DLL 314 can have a similar design as DLL 312. In one implementation, DLL 312 includes a phase detector 502, a charge pump 504, a loop filter 506, a variable delay element 508 and a fixed buffer delay 510.

In operation, phase detector 502 compares the phase of an output signal 524 of DLL 312 to that of a reference clock signal (e.g., the 10 GHz reference clock signal). In one implementation, phase detector 502 includes a D Flip Flop (D-FF) 516 that receives the reference clock signal as an input, and is triggered (or clocked) by output signal 524. Such a design ensures that output signal 524 will lead the reference clock signal by substantially (1) clock-to-Q delay.

Phase detector 502 generates an error signal 518 corresponding to a phase difference between output signal 524 and the reference clock signal. A charge pump 504 converts error signal 518 received from phase detector 502 into a charge pump output signal 520. Charge pump output signal 520 is smoothed by a loop filter 506 to generate a control signal 522 that is applied to one or more tuneable delay buffers 512 within variable delay element 508.

Variable delay element 508 receives a divided clock signal (e.g., the 5 GHZ clock signal) and accordingly delays the divided clock signal (in combination with fixed buffer delay 510) such that the divided clock signal is substantially aligned with the reference clock signal. More specifically, each tuneable delay buffer 512 delays the divided clock signal in response to control signal 522 received from loop filter 506. The divided clock signal is then further delayed by an additional fixed amount of time through one or more buffers 514 that are used to increase a drive capability of the divided clock signal (e.g., output signal 524).

FIG. 6 illustrates one implementation of charge pump 504. Charge pump 504 includes a biasing circuit 602, a differential charge pump circuit 604 and a common mode feedback circuit 606. Biasing circuit includes PMOS transistors M1–M2 and NMOS transistors M3–M5. Differential charge pump circuit 604 includes PMOS transistors M6–M9 and NMOS transistors M10–M15. Common mode feedback circuit 606 includes NMOS transistors M16–M17.

The sources of PMOS transistors M1–M2 and M6–M9 are in communication with a high side power supply VDD. The gates of PMOS transistors M1–M2 are each in communication with the drain of PMOS transistor M1. The drain of PMOS transistor M1 is in communication with the drain of NMOS transistor M3. The source of NMOS transistor M3 is in communication with a low side power supply VSS. The gate of NMOS transistor M3 is in communication with the gates of NMOS transistors M13–M14, and the drain of NMOS transistor M14. The drain of PMOS transistor M2 is in communication with the drain and gate of NMOS transistor M4. The source of transistor M4 is in communication with the drain is NMOS transistor M5. The gate of NMOS transistor M4 is also in communication with the gates of NMOS transistors M12, M15. The source of NMOS transistor M5 is in communication with low side power supply VSS. The gate of NMOS transistor M5 is in communication with high side power supply VDD.

The drains of PMOS transistors M6, M9 are in communication with a differential output node of differential charge pump circuit 604. In one implementation, the signal output from the differential output node of charge pump circuit 604 represents charge pump output signal 520. The drain of PMOS transistor M9 is also in communication with the drain of NMOS transistor M15 and the gate of NMOS transistor M17. The drain of PMOS transistor M6 is also in communication with the drain of NMOS transistor M12 and the gate of NMOS transistor M16. The gate of PMOS transistor M6 is in communication with the gate and drain of PMOS transistor M7. The source of NMOS transistor M12 is in communication with the drain of NMOS transistor M16 and the drain of NMOS transistor M17. The source of NMOS transistor M16 is in communication with low side power supply VSS.

The drains of PMOS transistors M7, M8 are in communication with the drains of NMOS transistors M10, M11, respectively. The gates of NMOS transistors M10, M11 form a differential input node of differential charge pump circuit 604. In one implementation, the signal received by the differential input node of charge pump circuit 604 represents error signal 518 output from D-FF 516. The sources of NMOS transistors M10, M11 are in communication with the drain of NMOS transistor M13. The source of NMOS transistor M13 is in communication with low side power supply VSS. The source of NMOS transistor M15 is in communication with the drain of NMOS transistor M17. The source the NMOS transistor M17 is in communication with low side power supply VSS.

In operation, differential charge pump circuit 604 receives a differential error signal (e.g., error signal 518). Common mode feedback circuit 606 adjusts charge pump output signal 520 based on a common mode voltage level of charge pump output signal 520. In one implementation, each NMOS transistor M16, M17 is operated in or near the triode region. A resistance of each NMOS transistor M16, M17 is therefore given by the following equation.

$$R = \frac{1}{(\mu_n)(C_{ox})(2V_{ON} - 2V_{TH})} \quad \text{(eq. 1)}$$

where $\mu_n$ represents a physical constant referred to as the electron mobility, $C_{ox}$ represents the oxide capacitance, L and W represent the length and width, respectively, of NMOS transistors M16, M17, $V_{TH}$ represents a threshold voltage of NMOS transistors M16, M17, and $V_{ON}$ represents the common mode voltage of charge pump output signal 520. As the common mode voltage level of charge pump output signal 520 increases, the respective resistances of NMOS transistors M16, M17 decrease. As a result a voltage drop across NMOS transistors M16, M17 decreases, current source NMOS transistors M12, M15 draw more current, and a voltage level of charge pump output signal 520 decreases.

In one implementation, differential charge pump circuit 604 has a wide operating range as a result of a first current mirror formed by PMOS transistor M6 and NMOS transistor M12 and a second current mirror formed by PMOS transistor M9 and NMOS transistor M15. The current mirrors eliminate a DC offset voltage across current source NMOS transistor M13, allowing a near rail-to-rail range of operation for differential charge pump circuit 604.

FIG. 7 illustrates one implementation of a tuneable delay buffer 512. Tuneable delay buffer 512 includes a first stage circuit 700 and a second stage circuit 702. First stage circuit 700 includes PMOS transistors M18–M22, NMOS transistors M23–M24, resistor R1 and voltage bias source VBIAS1. Second stage circuit 702 includes NMOS transistors M25–M33, resistors R2–R17 and voltage bias source VBIAS2.

In operation, first stage circuit 700 generates control voltages 710, 712 for steering a divided clock signal (e.g., the 5 GHz clock signal) through one or more signal paths within a second stage circuit 702. In one implementation, control voltages 710, 712 are adjusted by a control signal (e.g., control signal 522) output from a loop filter (e.g., loop filter 506). In one implementation, second stage circuit 702 includes two signal paths, the first signal path includes (2) delay stages 704, 706, and the second signal path includes (1) delay stage 708. Thus, the first signal path is a slower signal path relative to the second signal path. Accordingly, a delay of the divided clock signal can be tuned by diverting more or less of the divided clock signal through the first (slow) signal path and/or the second (fast) signal path. For example, 60% of the divided clock signal can be diverted through the first signal path, and 40% of the divided clock signal can be diverted through the second signal path.

FIG. 8 illustrates a block diagram of a transceiver system 800. In one implementation, transceiver system 800 is IEEE SONET OC-192 compliant. Transceiver system 800 can also be compliant with other IEEE standards, e.g., IEEE XAUI (2.5/3.125 Gb/s). Transceiver system 800 includes a transmitter 802, a receiver 804, and a transmission channel 806. Transmission channel 806 passes signals (e.g., analog signals) from transmitter 802 to receiver 804. Transmission channel 806 can include any type of wire line channel, for example, a single-ended transmission wire line or a pair of differential transmission wire lines (e.g., a Cat-5 twisted pair cable, optical fiber, printed circuit board (PCB) transmission line, and so on). Transmitter 802 includes PLL clock divider 300 for generating one or more clock signals, each having a different phase, that are aligned with a reference clock signal. In one implementation, the one or more clock signals generated by PLL clock divider 300 are used to combine parallel data streams into a serial data stream that is transmitted to receiver 804 over transmission channel 806.

A number of implementations have been described. Nevertheless, it will be understood that various modifications may be made without departing from the spirit and scope of the invention. Accordingly, other implementations are within the scope of the following claims.

What is claimed is:

1. A phase locked loop (PLL) clock divider, comprising:
 a voltage controlled oscillator (VCO) operable to generate a reference clock signal having a reference frequency;
 a first divider operable to divide the reference clock signal and generate a first divided clock signal having a first frequency;
 a first delay locked loop operable to substantially align the first divided clock signal to the reference clock signal;
 a second divider operable to divide the substantially aligned first divided clock signal and generate a second divided clock signal having a second frequency; and
 a second delay locked loop operable to substantially align the second divided clock signal to the reference clock signal.

2. The PLL clock divider of claim 1, further comprising:
 a third divider operable to divide the substantially aligned second divided clock signal and generate a third divided clock signal having a third frequency; and
 a fourth divider operable to divide the third divided clock signal and generate a fourth divided clock signal having a fourth frequency.

3. The PLL clock divider of claim 2, further comprising:
 a third delay locked loop operable to substantially align the third divided clock signal to the reference clock signal; and
 a fourth delay locked loop operable to substantially align the fourth divided clock signal to the reference clock signal.

4. The PLL clock divider of claim 2, further comprising one or more buffers to substantially align each of the third divided clock signal and the fourth divided clock signal to the reference clock signal.

5. The PLL clock divider of claim 1, wherein each of the first divided clock signal and the second divided clock signal are substantially aligned such that each divided clock signal leads the reference clock signal by a predetermined amount.

6. The PLL clock divider of claim 5, wherein the predetermined amount is substantially (1) clock to Q delay.

7. The PLL clock divider of claim 1, wherein the first delay locked loop include a first phase detector operable to compare a phase of the reference clock signal to a phase of the first divided clock signal and generate a first error signal corresponding to a phase difference between the reference clock signal and the first divided clock signal, and wherein the second delay locked loop include a second phase detector operable to compare a phase of the reference clock signal to a phase of the second divided clock signal and generate a second error signal corresponding to a phase difference between the reference clock signal and the second divided clock signal.

8. The PLL clock divider of claim 7, wherein the first and second phase detectors each comprises a D Flip Flop that receives the reference clock signal as an input and is triggered by the first divided clock signal and the second divided clock signal, respectively.

9. The PLL clock divider of claim 7, wherein the first and second delay locked loops each further comprises a charge pump operable to convert the first and second error signals, respectively, into corresponding first and second charge pump output signals.

10. The PLL clock divider of claim 9, wherein each charge pump includes:
 a differential charge pump circuit;
 a biasing stage operable to bias the differential charge pump circuit; and
 a common mode feedback circuit operable to adjust the first and second charge pump output signals, respectively, based on a common mode voltage level of the charge pump output signal.

11. The PLL clock divider of claim 10, wherein the common mode feedback circuit comprises one or more NMOS transistors that are each operating in or near a triode region.

12. The PLL clock divider of claim 9, wherein the first and second delay locked loops each further comprises a loop filter operable to smooth the first and second charge pump output signals, respectively, and generate a control signal to respectively control a delay of the first and second divided clock signals.

13. The PLL clock divider of claim 12, wherein the first and second delay locked loops each further comprises a variable delay element operable to respectively delay the first and second divided clock signals responsive to a corresponding control signal.

14. The PLL clock divider of claim 13, wherein each variable delay element comprises one or more corresponding tuneable delay buffers, each tuneable delay buffer operable to respectively delay the first and second divided clock signals through one or more corresponding signal paths, each signal path providing a different delay for the first and second divided clock signals, respectively.

15. The PLL clock divider of claim 13, wherein the first and second delay locked loops each further comprises a fixed buffer delay operable to respectively delay the first and second divided clock signals by a pre-determined amount and increase a drive capability of the first and second divided clock signals, respectively.

16. A transceiver comprising:
 a PLL clock divider including
  a voltage controlled oscillator (VCO) operable to generate a reference clock signal having a reference frequency;
  a first divider operable to divide the reference clock signal and generate a first divided clock signal having a first frequency;
  a first delay locked loop operable to substantially align the first divided clock signal to the reference clock signal;
  a second divider operable to divide the substantially aligned first divided clock signal and generate a second divided clock signal having a second frequency; and a second delay locked loop operable to substantially align the second divided clock signal to the reference clock signal.

17. The transceiver of claim 16, wherein the transceiver is IEEE SONET OC-192 or IEEE XAUI compliant.

18. A phase locked loop (PLL) clock divider, comprising:
a divider operable to divide a reference clock signal and generate a divided clock signal, the divided clock signal having a different frequency relative to the reference clock signal; and
a delay locked loop operable to substantially align the divided clock signal to the reference clock signal.

19. The PLL clock divider of claim 18, wherein the substantially aligned divided clock signal leads the reference clock signal by a predetermined amount.

20. The PLL clock divider of claim 19, wherein the predetermined amount is substantially (1) clock to Q delay.

21. The PLL clock divider of claim 18, wherein the delay locked loop includes a phase detector operable to compare a phase of the reference clock signal to a phase of the divided clock signal and generate an error signal corresponding to a phase difference between the reference clock signal and the divided clock signal.

22. The PLL clock divider of claim 21, wherein the phase detector comprises a D Flip Flop that receives the reference clock signal as an input and is triggered by the divided clock signal.

23. The PLL clock divider of claim 21, wherein the delay locked loop further comprises a charge pump operable to convert the error signal into a charge pump output signal.

24. A PLL clock divider, comprising:
a divider operable to divide a reference clock signal and generate a divided clock signal the divided clock signal having a different frequency relative to the reference clock signal; and
a delay locked loop operable to substantially align the divided clock signal to the reference clock signal, wherein the delay locked loop includes a phase detector operable to compare a phase of the reference clock signal to a phase of the divided clock signal and generate an error signal corresponding to a phase difference between the reference clock signal and the divided clock signal and further comprises a charge pump operable to convert the error signal into a charge pump output signal,
wherein the charge pump includes:
a differential charge pump circuit;
a biasing stage operable to bias the differential charge pump circuit; and
a common mode feedback circuit operable to adjust the charge pump output signal based on a common mode voltage level of the charge pump output signal.

25. The PLL clock divider of claim 24, wherein the common mode feedback circuit comprises one or more NMOS transistors operating in or near a triode region.

26. The PLL clock divider of claim 23, wherein the delay locked loop further comprises a loop filter operable to smooth the charge pump output signal and generate a control signal to control a delay of the divided clock signal.

27. The PLL clock divider of claim 26, wherein the delay locked loop further comprises a variable delay element operable to delay the divided clock signal responsive to the control signal.

28. The PLL clock divider of claim 27, wherein the variable delay element comprises one or more tuneable delay buffers, each tuneable delay buffer operable to delay the divided clock signal through one or more signal paths, each signal path providing a different delay for the divided clock signal.

29. The PLL clock divider of claim 27, wherein the delay locked loop further comprises a fixed buffer delay operable to delay the divided clock signal by a pre-determined amount and increase a drive capability of the divided clock signal.

30. The PLL clock divider of claim 18, further comprising a voltage controlled oscillator (VCO) operable to generate the reference clock signal.

31. A transceiver comprising:
a PLL clock divider including
a divider operable to divide a reference clock signal and generate a divided clock signal, the divided clock signal having a different frequency relative to the reference clock signal; and
a delay locked loop operable to substantially align the divided clock signal to the reference clock signal.

32. The transceiver of claim 31, wherein the transceiver is IEEE SONET OC-192 or IEEE XAUI compliant.

33. A phase locked loop (PLL) clock divider, comprising:
means for generating a reference clock signal having a reference frequency;
means for dividing the reference clock signal and generating a first divided clock signal having a first frequency;
means for substantially aligning the first divided clock signal to the reference clock signal;
means for dividing the substantially aligned first divided clock signal and generating a second divided clock signal having a second frequency; and
means for substantially aligning the second divided clock signal to the reference clock signal.

34. The PLL clock divider of claim 33, further comprising:
means for dividing the substantially aligned second divided clock signal and generating a third divided clock signal having a third frequency; and
means for dividing the third divided clock signal and generating a fourth divided clock signal having a fourth frequency.

35. The PLL clock divider of claim 34, further comprising:
means for substantially aligning the third divided clock signal to the reference clock signal; and
means for substantially aligning the fourth divided clock signal to the reference clock signal.

36. The PLL clock divider of claim 34, further comprising one or more buffer means for substantially aligning each of the third divided clock signal and the fourth divided clock signal to the reference clock signal.

37. The PLL clock divider of claim 33, wherein each of the first divided clock signal and the second divided clock signal are substantially aligned such that each divided clock signal leads the reference clock signal by a predetermined amount.

38. The PLL clock divider of claim 37, wherein the predetermined amount is substantially (1) clock to Q delay.

39. The PLL clock divider of claim 33, wherein:
the means for substantially aligning the first divided clock signal include means for comparing a phase of the reference clock signal to a phase of the first divided clock signal and generating a first error signal corresponding to a phase difference between the reference clock signal and the first divided clock signal; and the means for substantially aligning the second divided clock signal include means for comparing a phase of the reference clock signal to a phase of the second divided clock signal and generating a second error signal corresponding to a phase difference between the reference clock signal and the second divided clock signal.

40. The PLL clock divider of claim 39, wherein the means for comparing a phase of the reference clock signal to a phase of the first divided clock signal and the means for comparing a phase of the reference clock signal to a phase of the second divided clock signal each comprises a D Flip Flop means that receives the reference clock signal as an input and is triggered by the first divided clock signal and the second divided clock signal, respectively.

41. The PLL clock divider of claim 39, wherein the means for substantially aligning the first divided clock signal and the means for substantially aligning the second divided clock signal each further comprises means for converting the first and second error signals, respectively, into corresponding first and second charge pump output signals.

42. The PLL clock divider of claim 41, wherein the means for converting the first error signal and the means for converting the second error signal each includes:
  differential charge pump circuit means;
  means for biasing the differential charge pump circuit means; and
  means for adjusting the first and second charge pump output signals, respectively, based on a common mode voltage level of the charge pump output signal.

43. The PLL clock divider of claim 42, wherein the means for adjusting the first and second charge pump output signals, respectively, comprise one or more NMOS transistor means operating in or near a triode region.

44. The PLL clock divider of claim 41, wherein the means for substantially aligning the first divided clock signal and the means for substantially aligning the second divided clock signal each further comprises means for smoothing the first and second charge pump output signals, respectively, and generating a control signal to respectively control a delay of the first and second divided clock signals.

45. The PLL clock divider of claim 44, wherein the means for substantially aligning the first divided clock signal and the means for substantially aligning the second divided clock signal each further comprises means for respectively delaying the first and second divided clock signals responsive to a corresponding control signal.

46. The PLL clock divider of claim 45, wherein the means for delaying the first and second divided clock signals responsive to a corresponding control signal each comprises one or more corresponding tuneable delay buffer means, each tuneable delay buffer means for respectively delaying the first and second divided clock signals through one or more corresponding signal path means, each signal path means providing a different delay for the first and second divided clock signals, respectively.

47. The PLL clock divider of claim 45, wherein the means for substantially aligning the first divided clock signal and the means for substantially aligning the second divided clock signal each further comprises a fixed buffer delay means for respectively delaying the first and second divided clock signals by a predetermined amount and increasing a drive capability of the first and second divided clock signals, respectively.

48. A phase locked loop (PLL) clock divider, comprising:
  means for dividing a reference clock signal and generating a divided clock signal, the divided clock signal having a different frequency relative to the reference clock signal; and
  means for substantially aligning the divided clock signal to the reference clock signal.

49. The PLL clock divider of claim 48, wherein the divided clock signal leads the reference clock signal by a predetermined amount.

50. The PLL clock divider of claim 49, wherein the predetermined amount is substantially (1) clock to Q delay.

51. The PLL clock divider of claim 48, wherein the means for substantially aligning the divided clock signal include means for comparing a phase of the reference clock signal to a phase of the divided clock signal and generating an error signal corresponding to a phase difference between the reference clock signal and the divided clock signal.

52. The PLL clock divider of claim 51, wherein the means for comparing a phase comprise a D Flip Flop means that receives the reference clock signal as an input and is triggered by the divided clock signal.

53. The PLL clock divider of claim 51, wherein the means for substantially aligning the divided clock signal further comprise means for converting the error signal into a charge pump output signal.

54. A PLL clock divider, comprising:
  means for dividing a reference clock signal and generating a divided clock signal, the divided clock signal having a different frequency relative to the reference clock signal; and
  means for substantially aligning the divided clock signal to the reference clock signal, wherein the means for substantially aligning the divided clock signal include means for comparing a phase of the reference clock signal to a phase of the divided clock signal and generating an error signal corresponding to a phase difference between the reference clock signal and the divided clock signal and further comprising means for converting the error signal into a charge pump output signal, wherein the means for converting the error signal include:
  a differential charge pump circuit means;
  means for biasing the differential charge pump circuit means; and
  means for adjusting the charge pump output signal based on a common mode voltage level of the charge pump output signal.

55. The PLL clock divider of claim 54, wherein the means for adjusting the charge pump output signal comprise one or more NMOS transistor means operating in or near a triode region.

56. The PLL clock divider of claim 53, wherein the means for substantially aligning the divided clock signal further comprise means for smoothing the charge pump output signal and generating a control signal to control a delay of the divided clock signal.

57. The PLL clock divider of claim 56, wherein the means for substantially aligning the divided clock signal further comprise means for delaying the divided clock signal responsive to the control signal.

58. The PLL clock divider of claim 57, wherein the means for delaying the divided clock signal responsive to the control signal comprise one or more tuneable delay buffer means, each tuneable delay buffer means for delaying the divided clock signal through one or more signal path means, each signal path means providing a different delay for the divided clock signal.

59. The PLL clock divider of claim 57, wherein the means for substantially aligning the divided clock signal further comprises fixed buffer delay means for delaying the divided clock signal by a pre-determined amount and increasing a drive capability of the divided clock signal.

60. The PLL clock divider of claim 48, further comprising means for generating the reference clock signal.

61. A transceiver comprising:
a PLL clock divider including
means for dividing a reference clock signal and generating a divided clock signal, the divided clock signal having a different frequency relative to the reference clock signal; and
means for substantially aligning the divided clock signal to the reference clock signal.

62. The transceiver of claim 61, wherein the transceiver is IEEE SONET OC-192 or IEEE XAUI compliant.

63. A method, comprising:
dividing a reference clock signal and generating a divided clock signal, the divided clock signal having a different frequency relative to the reference clock signal; and
substantially aligning the divided clock signal to the reference clock signal.

64. The method of claim 63, wherein the substantially aligned divided clock signal leads the reference clock signal by a predetermined amount.

65. The method of claim 64, wherein the predetermined amount is substantially (1) clock to Q delay.

66. The method of claim 63, wherein substantially aligning the divided clock signal to the reference clock signal includes comparing a phase of the reference clock signal to a phase of the divided clock signal and generating an error signal corresponding to a phase difference between the reference clock signal and the divided clock signal.

67. The method of claim 66, wherein substantially aligning the divided clock signal to the reference clock signal further includes converting the error signal into a charge pump output signal.

68. The method of claim 67, wherein substantially aligning the divided clock signal to the reference clock signal further includes smoothing the charge pump output signal and generating a control signal to control a delay of the divided clock signal.

69. The method of claim 68, wherein substantially aligning the divided clock signal to the reference clock signal further includes delaying the divided clock signal responsive to the control signal.

70. The method of claim 69, wherein delaying the divided clock signal responsive to the control signal includes delaying the divided clock signal through one or more signal paths, each signal path providing a different delay for the divided clock signal.

71. The method of claim 70, wherein delaying the divided clock signal responsive to the control signal further includes delaying the divided clock signal by a pre-determined amount and increasing a drive capability of the divided clock signal.

72. The method of claim 63, further comprising generating the reference clock signal.

* * * * *